United States Patent
Park et al.

(10) Patent No.: US 7,791,095 B2
(45) Date of Patent: Sep. 7, 2010

(54) SEMICONDUCTOR LIGHT EMITTING DIODE

(75) Inventors: Nae Man Park, Daejeon (KR); Kyung Hyun Kim, Daejeon (KR); Tae Youb Kim, Seoul (KR); Gun Yong Sung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 990 days.

(21) Appl. No.: 10/572,486

(22) PCT Filed: Aug. 5, 2005

(86) PCT No.: PCT/KR2005/002558

§ 371 (c)(1),
(2), (4) Date: Mar. 16, 2006

(87) PCT Pub. No.: WO2006/016758

PCT Pub. Date: Feb. 16, 2006

(65) Prior Publication Data

US 2009/0001401 A1    Jan. 1, 2009

(30) Foreign Application Priority Data

Aug. 11, 2004    (KR) ...................... 10-2004-0063025

(51) Int. Cl.
*H01L 33/00*    (2010.01)
(52) U.S. Cl. .................... 257/99; 257/98; 257/E33.062
(58) Field of Classification Search .................... 257/98, 257/99, E33.062
See application file for complete search history.

(56) References Cited

U.S. PATENT DOCUMENTS

| 6,693,306 | B2 * | 2/2004 | Chen et al. ..................... 257/99 |
| 6,727,167 | B2   | 4/2004 | Gottfried |
| 7,005,680 | B2 * | 2/2006 | Otsuka et al. ................. 257/91 |
| 2002/0093023 | A1 * | 7/2002 | Camras et al. ................ 257/94 |
| 2003/0183828 | A1 | 10/2003 | Lee et al. |
| 2005/0035354 | A1 | 2/2005 | Lin et al. |
| 2005/0067623 | A1 | 3/2005 | Ha et al. |

FOREIGN PATENT DOCUMENTS

DE    100 17 758 A1    12/2000

(Continued)

OTHER PUBLICATIONS

David Ginley, et al; "Non-vacuum and PLD growth of next generation TCO materials" Thin Solid Films, Elsevier-Sequoia S.A. Lausanne, CH, vol. 445, No. 2, Dec. 15, 2003, pp. 193-198, XP004479591, ISSN: 0040-6090.

(Continued)

*Primary Examiner*—Thinh T Nguyen
(74) *Attorney, Agent, or Firm*—Ladas & Parry LLP

(57) ABSTRACT

Provided is a semiconductor light emitting diode, in which a plurality of upper electrodes is formed on a surface of an upper doping layer or an emission layer and at least one lower electrode is formed on a surface of a lower doping layer or a substrate in a silicon-based light emitting diode or a nitride-based light emitting diode to enhance a spreading characteristic of current applied to the electrodes, thereby maximizing an emitting area of the emission layer and inducing an emission having a uniform intensity on an entire surface of the emission layer to further enhance the luminous efficiency of the light emitting diode.

14 Claims, 1 Drawing Sheet

| | FOREIGN PATENT DOCUMENTS | | |
|---|---|---|---|
| JP | 1136431 | 2/1999 | |
| JP | 10229219 | 8/1999 | |
| JP | 02000277863 A | * 10/2000 | |
| JP | 2001319787 | 11/2001 | |
| JP | 2002335013 | 11/2002 | |
| JP | 2003-8062 A | 1/2003 | |
| JP | 200455646 | 2/2004 | |
| JP | 2004-134772 A | 4/2004 | |
| JP | 2004-186543 A | 7/2004 | |
| KR | 20030077149 | 10/2003 | |
| KR | 10-20040050733 | 6/2004 | |
| KR | 10-20040074328 | 8/2004 | |

OTHER PUBLICATIONS

European Search Report: PCT/KR2005002558, Jun. 25, 2009.

* cited by examiner

SEMICONDUCTOR LIGHT EMITTING DIODE

BACKGROUND ART

1. Field of the Invention

The present invention relates to a semiconductor light emitting diode, and more particularly, to a semiconductor light emitting diode capable of enhancing luminous efficiency of a light emitting diode by forming a plurality of upper electrodes on a surface of an emission layer or an upper doping layer and forming at least one lower electrode on a surface of a substrate or a lower doping layer in a silicon-based light emitting diode or a nitride-based light emitting diode to enhance a diffusive characteristic of current applied to the electrodes.

2. Description of Related Art

In general, two electrodes are used when a current is applied to an emission layer in a GaAs-based light emitting diode having a horizontal type structure or a vertical type structure.

In the case of the GaAs-based light emitting diode, an electrical characteristic of the GaAs substrate itself is good and mobility of an electron or hole is very fast, so that the current spreading is not a cause of degrading luminous efficiency of the light emitting diode when a current is applied from the electrode to the emission layer.

However, in the case of a silicon-based or nitride-based light emitting diode which has a relatively poor characteristic of the current spreading, effective current spreading is not uniformly carried out on the entire surface of a doping layer, which causes a non-uniform current to be applied to the emission layer so that local emission occurs instead of overall emission of the emission layer, thereby degrading the emission properties.

SUMMARY OF THE INVENTION

The present invention is directed to provide a semiconductor light emitting diode by forming a plurality of upper electrodes on a surface of an upper doping layer or an emission layer and forming at least one lower electrode on a surface of a lower doping layer or a substrate in a silicon-based light emitting diode or a nitride-based light emitting diode to enhance a spreading characteristic of current applied to the electrodes, thereby capable of maximizing an emitting area of the emission layer and inducing emission having a uniform intensity on the entire surface of the emission layer to further enhance the luminous efficiency of the light emitting diode.

One aspect of the present invention is to provide a semiconductor light emitting diode composed of an emission layer formed on a substrate and electrodes for applying a voltage difference to the emission layer, and the electrodes includes: at least one lower electrode formed on a predetermined region of the substrate; and a plurality of upper electrodes formed on a predetermined region of the emission layer and spaced apart from each other by a constant interval.

Preferably, a lower doping layer is further included between the substrate, and the emission layer and the lower electrode.

Preferably, an upper doping layer is further included between the emission layer and the upper electrodes.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

Figure 1:
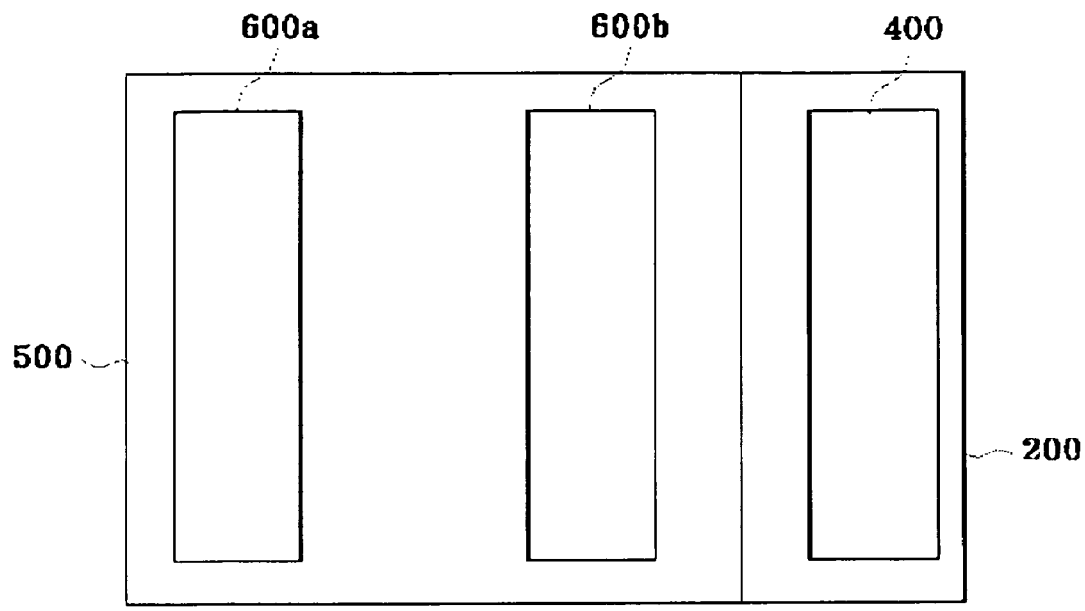
FIG. 1 is a plan view of a semiconductor light emitting diode in accordance with an embodiment of the present invention.
Figure 2:
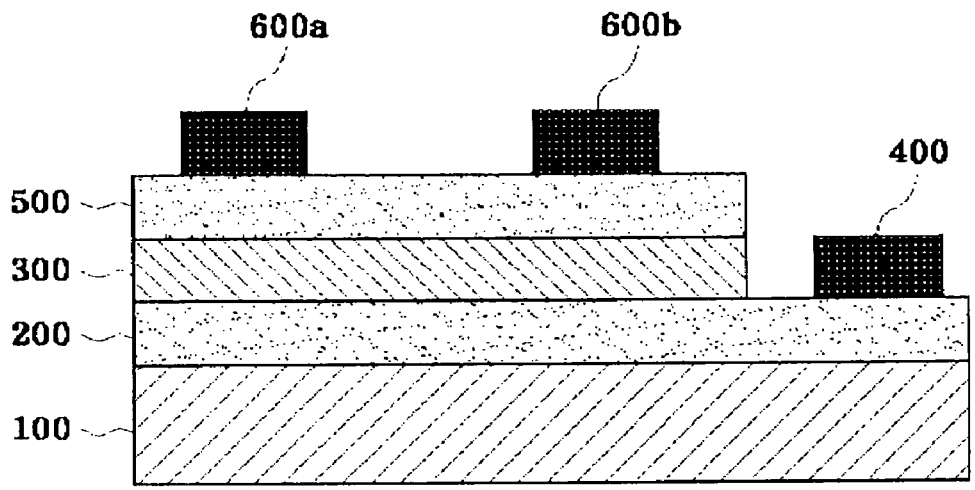
FIG. 2 is a cross-sectional view of a semiconductor light emitting diode in accordance with an embodiment of the present invention.

FIG. 1 is a plan view of a semiconductor light emitting diode in accordance with an embodiment of the present invention, and FIG. 2 is a cross-sectional view of a semiconductor light emitting diode in accordance with an embodiment of the present invention.

Referring to FIGS. 1 and 2, a lower doping layer 200 which is doped with an n-type impurity ion or a p-type impurity ion is formed on a substrate 100 (e.g. a p-type or n-type semiconductor substrate), an emission layer 300 having the emission properties is formed on a predetermined region of the lower doping layer 200, and at least one lower electrode 400 is formed on a predetermined region of the lower doping layer 200 where the emission layer 300 is not formed.

In addition, an upper doping layer 500 for supplying an external current is formed on the emission layer 300. The upper doping layer 500 has a polarity opposite to a polarity of the lower doping layer 200 so as to form a pn-junction as a basic structure of a light emitting diode, and is preferably formed of a transparent doping layer.

A pair of first and second upper electrodes 600a and 600b is formed to be spaced apart from each other by a constant interval on a predetermined region of the upper doping layer 500. Such first and second upper electrodes 600a and 600b are formed to have the same electrical characteristic as the upper doping layer 500, and are preferably formed of a transparent electrode. In this case, the first upper electrode 600a forms a vertical current direction, and the second upper electrode 600b forms a horizontal current direction. That is, the second upper electrode 600b positioned relatively near the lower electrode 400 has the same electrical polarity, that is, a positive polarity (+) or a negative polarity (−), as the lower electrode to induce the horizontal current, and the other upper electrode 600a induces the vertical current. The current applied via the first and second upper electrodes 600a and 600b and the lower electrode 400 should be sufficiently diffracted before it reaches the emission layer 300 to allow a uniform current to be applied to the entire surface of the emission layer 300, and such a current control can be implemented by properly controlling voltages among the three electrodes 600a, 600b and 400. In addition, shape and size of the first and second upper electrodes 600a and 600b are preferably the same as each other, however, not limited thereto, but may vary to be different from each other.

In addition, a horizontal distance between the first and second upper electrodes 600a and 600b is preferably formed to be longer than a vertical distance between the upper electrodes and the lower electrode 400, however, not limited thereto, the horizontal distance between the first and second upper electrodes 600a and 600b may be made to be shorter than the vertical distance between the upper electrodes and the lower electrode 400.

In addition, the lower electrode 400 employed for the present invention is formed on a predetermined region of the lower doping layer 200, however, not limited thereto, but may be directly formed on a predetermined region of the conductive substrate 100.

In addition, the first and second upper electrodes 600a and 600b applied to the present invention are formed on predetermined regions of the upper doping layer 500, however, not limited thereto, but may be directly formed on predetermined regions of the emission layer 300.

Meanwhile, the first and second upper electrodes 600a and 600b and the lower electrode 400 are preferably metal electrodes formed of a material such as Au, Al, Pt, Ni, Cu, a plurality of alloy electrodes, or multi-layered metal thin film, however, not limited thereto, but may be oxide electrodes formed of InSnO, ZnO, $SnO_2$, NiO, $Cu_2SrO_2$ and so forth, or oxide electrodes such as $CuInO_2$:Ca, InO:Mo and so forth doped with an n-type or p-type material. In this case, when the first and second upper electrodes 600a and 600b and the lower electrode 400 are formed of metal electrodes, alloy electrodes, or multi-layered metal thin films, each thickness is preferably about 3Å to 100Å.

According to the semiconductor light emitting diode having the above-described configuration of the present invention, a plurality of upper electrodes is formed on a surface of an upper doping layer or an emission layer and at least one lower electrode is formed on a surface of a lower doping layer or a substrate in a silicon-based light emitting diode or a nitride-based light emitting diode to apply a proper voltage to the electrodes so that the current can flow in a horizontal direction as well as a vertical direction, thereby enhancing a spreading characteristic of the current applied to the electrodes (e.g. a phenomenon in which the current flows in the horizontal direction), maximizing an emitting area of the emission layer, and inducing emission having a uniform intensity on the entire surface of the emission layer to further enhance the luminous efficiency of the light emitting diode.

For example, in the semiconductor light emitting diode according to one embodiment of the present invention, a pair of upper electrodes 600a and 600b and one lower electrode 400 are formed, however, not limited thereto, but at least two upper electrodes and at least one lower electrode may be formed.

As mentioned above, according to the semiconductor light emitting diode of the present invention, a plurality of upper electrodes is formed on a surface of an upper doping layer or an emission layer and at least one lower electrode is formed on a surface of a lower doping layer or a substrate in a silicon-based light emitting diode or a nitride-based light emitting diode to enhance the spreading characteristic of the current applied to the electrodes, thereby maximizing an emitting area of the emission layer and inducing emission having a uniform intensity on the entire surface of the emission layer to further enhance the luminous efficiency of the light emitting diode.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

The invention claimed is:

1. A semiconductor light emitting diode comprising:
an emission layer formed on a substrate;
one lower electrode formed on a predetermined region of the substrate; and
two upper electrodes formed on a predetermined region of the emission layer so as to be substantially evenly distributed with respect to an area defined by the predetermined region of the emission layer,
wherein the two upper electrodes include a first upper electrode positioned near the lower electrode having the same electrical polarity as the lower electrode to induce a horizontal current, and a second upper electrode adapted to induce a vertical current.

2. The semiconductor light emitting diode according to claim 1, further comprising:
a lower doping layer formed between the substrate, and the emission layer and the lower electrode.

3. The semiconductor light emitting diode according to claim 1, further comprising an upper doping layer formed between the emission layer and the upper electrodes.

4. The semiconductor light emitting diode according to claim 1, wherein the upper electrodes have the same shape and size.

5. The semiconductor light emitting diode according to claim 1, wherein a horizontal distance between the upper electrodes is greater than a vertical distance between the upper electrode and the lower electrode.

6. The semiconductor light emitting diode according to claim 1, wherein a horizontal distance between the upper electrodes is less than a vertical distance between the upper electrode and the lower electrode.

7. The semiconductor light emitting diode according to claim 1, wherein the upper electrodes and the lower electrodes are formed of any one of oxide electrodes formed of one of InSnO, ZnO, $SnO_2$, NiO and $Cu_2SrO_2$, and oxide electrodes formed of one of $CuInO_2$:Ca and InO:Mo and then doped with an n-type or p-type material.

8. The semiconductor light emitting diode according to claim 1, wherein the upper electrodes and the lower electrodes are formed of one of a metal electrode formed of a material selected from a group consisting of Au, Al, Pt, Ni, and Cu, a plurality of alloy electrodes, and a multi-layered metal thin film.

9. The semiconductor light emitting diode according to claim 8, wherein each of the metal electrode, the alloy electrodes, and the multi-layered metal thin film has a thickness in the range of 3 Å to 100 Å.

10. The semiconductor light emitting diode according to claim 1, wherein the substrate is a conductive substrate.

11. A semiconductor light emitting diode-comprising:
an emission layer formed on a substrate; and
a lower electrode formed on a predetermined region of the substrate;
a first upper electrode formed on a predetermined region of the emission layer and separated from the at least one lower electrode by a first distance;
a second upper electrode formed on the predetermined region of the emission layer and separated from the at least one lower electrode by a second distance that is less than the first distance;
wherein the first and second upper electrodes are distributed substantially evenly with respect to an area defined by the predetermined region of the emission layer,
the lower electrode and the first and second upper electrodes apply a voltage difference to the emission layer, and the first upper electrode induces a vertical current and the second upper electrode induces a horizontal current enhancing a spreading characteristic of a current applied to the lower electrode and the first and second upper electrodes and maximizing an emitting area of the emission layer.

12. The semiconductor light emitting diode according to claim 11, wherein the substrate is a conductive substrate.

13. The semiconductor light emitting diode according to claim 11, wherein the second upper electrode and the lower electrode have the same electrical polarity.

14. A method for maximizing an emitting area of an emission layer and inducing emission having a uniform intensity on the entire surface of the emission layer comprising:

forming a lower electrode on a first region of a substrate;

forming a plurality of upper electrodes comprising at least a first upper electrode and a second upper electrode on a surface of the emission layer which is disposed on a second region of the substrate, such that the plurality of upper electrodes are distributed substantially evenly with respect to an area defined by the surface of the emission layer, wherein a first distance separating the first upper electrode and the lower electrode is less than a second distance separating the second upper electrode and the lower electrode; and applying a first electric potential to the first upper electrode and the lower electrode and a second electric potential to the second upper electrode inducing both a vertical current and a horizontal current so as to enhance a spreading characteristic of a current applied to the lower electrode and the plurality of upper electrodes and maximize an emitting area of the emission layer, wherein the second electric potential is different than the first electric potential.

\* \* \* \* \*